(12) United States Patent
Dohi et al.

(10) Patent No.: US 10,109,660 B2
(45) Date of Patent: Oct. 23, 2018

(54) LAMINATED SEMICONDUCTOR DEVICE (71) Applicant: Panasonic Corporation, Osaka (JP)

(72) Inventors: Shigefumi Dohi, Kanagawa (JP); Toshitaka Akahoshi, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 116 days.

(21) Appl. No.: 14/807,488

(22) Filed: Jul. 23, 2015

(65) Prior Publication Data
US 2015/0333096 A1 Nov. 19, 2015

Related U.S. Application Data (63) Continuation of application No. PCT/JP2013/005897, filed on Oct. 3, 2013.

(30) Foreign Application Priority Data

Jan. 30, 2013 (JP) ................. 2013-015069

(51) Int. Cl.
*H01L 27/146* (2006.01)
*H01L 27/144* (2006.01)
*H01L 23/00* (2006.01)

(52) U.S. Cl.
CPC ............ *H01L 27/146* (2013.01); *H01L 24/19* (2013.01); *H01L 27/1443* (2013.01);
(Continued)

(58) Field of Classification Search
CPC ...................................................... H01L 27/146
See application file for complete search history.

(56) References Cited

U.S. PATENT DOCUMENTS 7,539,366 B1 * 5/2009 Baks .................... G02B 6/4201
385/14
2002/0027295 A1 * 3/2002 Kikuma .............. H01L 23/3121
257/780
(Continued)

FOREIGN PATENT DOCUMENTS

JP 2003-243604 A 8/2003
JP 2004-111415 A 4/2004
(Continued)

OTHER PUBLICATIONS

International Search Report of PCT application No. PCT/JP2013/005897 dated Dec. 10, 2013.

*Primary Examiner* — Joseph C Nicely
*Assistant Examiner* — Lamont Koo
(74) *Attorney, Agent, or Firm* — McDermott Will & Emery LLP (57) ABSTRACT

A laminated semiconductor device includes: a first semiconductor element provided with a photoelectric conversion region on its main surface; an extended portion extended outwardly from a side end surface of the first semiconductor element; a redistribution layer formed on a first surface of the extended portion; a second semiconductor element provided on the main surface of the first semiconductor element so as to extend to the extended portion from an outside of the photoelectric conversion region, the second semiconductor element being electrically connected to the first semiconductor element and the redistribution layer; and a first electrode pad formed on the redistribution layer and electrically connected to the second semiconductor element via the redistribution layer.

19 Claims, 9 Drawing Sheets

(52) U.S. Cl.
CPC .. *H01L 27/14618* (2013.01); *H01L 27/14634* (2013.01); *H01L 27/14636* (2013.01); *H01L 27/14643* (2013.01); *H01L 2224/45144* (2013.01); *H01L 2224/45147* (2013.01); *H01L 2224/49171* (2013.01); *H01L 2924/1461* (2013.01); *H01L 2924/15787* (2013.01); *H01L 2924/351* (2013.01)

(56) References Cited

U.S. PATENT DOCUMENTS

| | | | |
|---|---|---|---|
| 2003/0215993 A1 | 11/2003 | Oshima | |
| 2004/0070064 A1* | 4/2004 | Yamane | H01L 23/3114 257/686 |
| 2004/0084741 A1* | 5/2004 | Boon | H01L 31/0203 257/433 |
| 2005/0077451 A1* | 4/2005 | Minamio | H01L 25/167 250/214.1 |
| 2006/0063312 A1 | 3/2006 | Kurita | |
| 2006/0163728 A1* | 7/2006 | Nakanishi | H01L 21/561 257/738 |
| 2007/0045787 A1* | 3/2007 | Ino | G01P 1/023 257/666 |
| 2012/0205789 A1 | 8/2012 | Natsuaki et al. | |
| 2013/0299957 A1 | 11/2013 | Kobayashi et al. | |

FOREIGN PATENT DOCUMENTS

| | | |
|---|---|---|
| JP | 2006-019433 A | 1/2006 |
| JP | 2009-117760 | 5/2009 |
| JP | 2009-146979 | 7/2009 |
| JP | 2012-064837 | 3/2012 |
| JP | 2012-124305 | 6/2012 |
| JP | 2012-169440 A | 9/2012 |
| WO | 2012/107972 A1 | 8/2012 |

* cited by examiner

LAMINATED SEMICONDUCTOR DEVICE

BACKGROUND OF THE INVENTION

1. Field of the Invention

The present disclosure relates to a laminated semiconductor device including another electronic component on a semiconductor chip.

2. Description of the Related Art

PTL 1 discloses a semiconductor module having the configuration described below. Specifically, the semiconductor module includes a first semiconductor chip having a photoelectric conversion region; and a second semiconductor chip which is formed on the first semiconductor chip in a region where the photoelectric conversion region is not formed, the second semiconductor chip being electrically connected to the first semiconductor chip. The semiconductor module also includes a package which mounts the first semiconductor chip and the second semiconductor chip, and at least a region of the package facing the photoelectric conversion region is made of a translucent material. The semiconductor module also includes a thermal conductive member thermally connecting the second semiconductor chip and the package to each other. Since the semiconductor module includes the thermal conductive member thermally connecting the second semiconductor chip and the package to each other, heat generated from the second semiconductor chip can be released to the package via the thermal conductive member. This configuration can prevent heat generated from the second semiconductor chip from moving toward the photoelectric conversion region.

CITATION LIST

Patent Literature

PTL 1: Unexamined Japanese Patent Publication No. 2012-124305

SUMMARY OF THE INVENTION

In the technique described in PTL 1, a connection electrode to the second semiconductor chip and a connection electrode to a substrate on which the first semiconductor element is mounted are provided on the first semiconductor chip in the region outside the photoelectric conversion region. This results in increasing a planar size of the first semiconductor chip, whereby the number of chips obtained per one wafer is decreased. In this technique, the second semiconductor chip is electrically connected to the first semiconductor chip having the photoelectric conversion region formed thereon to transfer a signal from the photoelectric conversion region to the outside. Therefore, a collaborative design of upper and lower chips including an extraction terminal for the converted signal is needed, and therefore, a circuit design becomes complicated.

A laminated semiconductor device according to the present disclosure enables miniaturization of a first semiconductor chip, and is effective to prevent complexity of a circuit design of upper and lower chips, in a configuration in which an electronic component such as a second semiconductor element is provided on the first semiconductor element.

A laminated semiconductor device according to the present disclosure includes: a first semiconductor element provided with a photoelectric conversion region on a main surface thereof; an extended portion extended outwardly from a side end surface of the first semiconductor element; a redistribution layer formed on a first surface of the extended portion; an electronic component provided on the main surface of the first semiconductor element so as to extend to the extended portion from an outside of the photoelectric conversion region; and a first electrode pad formed on the redistribution layer. The electronic component is electrically connected to the first semiconductor element and the redistribution layer, the first electrode pad is electrically connected to the electronic component via the redistribution layer, and the electronic component forms a flip-chip connection with the first semiconductor element and the extended portion.

The laminated semiconductor device according to the present disclosure is effective to suppress an increase in a planar size of the lower semiconductor element provided with the photoelectric conversion region, and to avoid malfunction and restriction in a chip design caused by a stacking of an upper semiconductor element.

DETAILED DESCRIPTION OF THE PREFERRED EMBODIMENTS

A laminated semiconductor device according to the present disclosure will be described with reference to the drawings. It is to be noted that detailed descriptions will sometimes be omitted. For example, detailed descriptions for matters which have already been well known in the art and redundant descriptions for substantially the same configurations will sometimes be omitted. This is to prevent the description below from becoming unnecessarily redundant to facilitate understanding of a person skilled in the art.

Figure 1A:
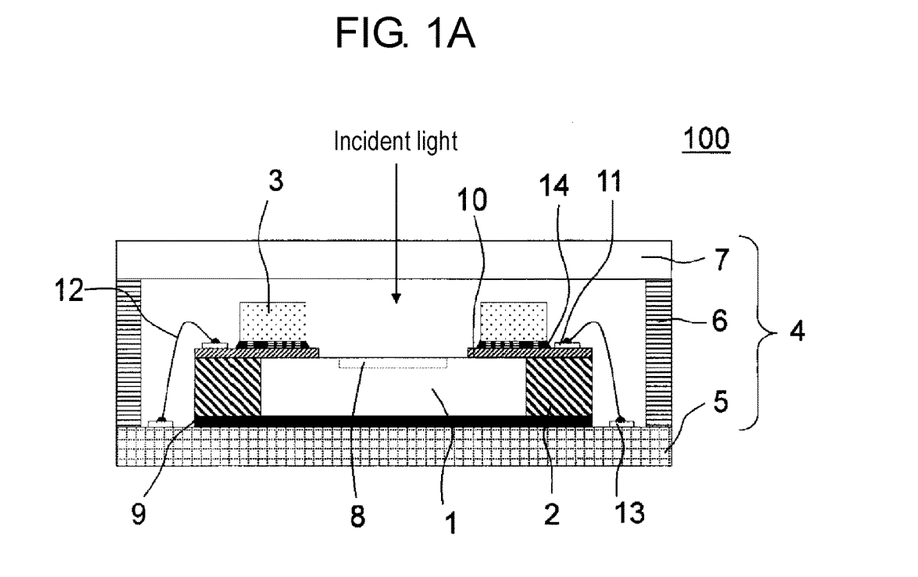
FIG. 1A is a sectional view illustrating a configuration of a laminated semiconductor device, taken along a line Ia-Ia in FIG. 1B, according to a first exemplary embodiment.
Figure 1B:
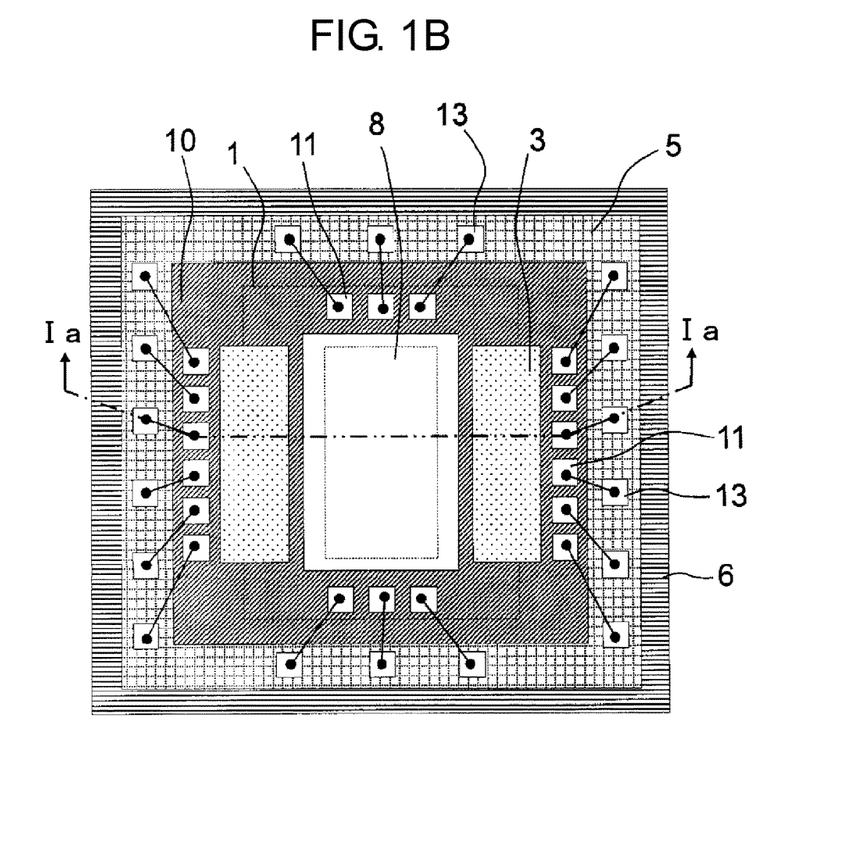
FIG. 1B is a plan view illustrating the configuration of the laminated semiconductor device according to the first exemplary embodiment.

Note that the accompanying drawings and the following description are provided in order for a person of ordinary skill in the art to sufficiently understand the present disclosure, and they are not intended to limit the subject matter set forth in the claims First Exemplary Embodiment FIG. 1A and FIG. 1B are respectively a sectional view and a plan view schematically illustrating a configuration of a laminated semiconductor device according to the present exemplary embodiment.

Laminated semiconductor device 100 illustrated in FIG. 1A includes first semiconductor element 1, extended portion 2 extended outwardly from a side end surface of first semiconductor element 1, second semiconductor element 3 placed to extend from first semiconductor element 1 to extended portion 2, and package 4 sealing first semiconductor element 1 and second semiconductor element 3.

Package 4 includes base 5, side wall 6 formed on base 5, and translucent cover 7 disposed to cover a main surface of first semiconductor element 1. Base 5 may be a wiring board such as a resin substrate or a ceramic substrate. Side wall 6 is formed to surround first semiconductor element 1 and second semiconductor element 3 as illustrated in FIG. 1B. Side wall 6 may be integrally formed with base 5, or may be formed separately from base 5. For example, when a ceramic substrate is used as a substrate forming base 5, side wall 6 is made of ceramic, and baked together with the ceramic substrate, whereby a production process can be simplified. When side wall 6 is formed separately from base 5, an optimum material can be selected for each of side wall 6 and translucent cover 7. For example, if side wall 6 is made of resin, processing becomes easy. Translucent cover 7 has a plate shape, and a material for translucent cover 7 is a translucent resin or a glass, for example. Translucent cover 7 is fixed to side wall 6 with an adhesive agent, for example.

First semiconductor element 1 is a semiconductor element (semiconductor chip) which includes a circuit formed on a silicon substrate. First semiconductor element 1 has on its main surface a photoelectric conversion region 8 in which photoelectric conversion circuits are arrayed in a matrix. First semiconductor element 1 receives incident light passing through translucent cover 7 and converts this light into an electric signal in photoelectric conversion region 8. A back surface of first semiconductor element 1 is fixed to base 5 via adhesive layer 9. Adhesive layer 9 is a metal paste, for example.

Extended portion 2 extends outwardly from the side end surface of first semiconductor element 1. A resin such as an epoxy resin that is easy to be molded and processed is suitable for a material of extended portion 2. Redistribution layer 10 including a redistribution and a protection layer covering the redistribution is formed to extend from the main surface of first semiconductor element 1 to a first surface of extended portion 2. The redistribution is generally formed by electroplating using photolithography, so that the redistribution can be formed to have a thickness ranging from about 3 μm to about 5 μm and to have any width. The redistribution is characterized by having a larger size and smaller electric resistance than a wiring in a semiconductor chip. Copper which can be formed with a simple process such as electroplating and has excellent electric conductivity is suitable for the redistribution. When a resin such as polyimide (PI) or polybenzoxazole (PBO) is used for the protection layer, the protection layer can be easily processed, whereby a high protection effect can be attained for first semiconductor element 1.

A first electrode mounted on a region of first semiconductor element 1 and a second electrode mounted on a region of extended portion 2 are formed on redistribution layer 10 at a region where second semiconductor element 3 is to be mounted. Further, electrode pad 11 is mounted at the outside of the region where second semiconductor element 3 is to be mounted.

As illustrated in FIG. 1A, electrode pad 11 is connected to electrode pad 13 of base 5 via first connection member 12. Electrode pad 11 on redistribution layer 10 may be made of copper or nickel, or may have a laminated structure of copper/solder or nickel/gold. Examples of a composition of a solder used here include tin-silver alloy, tin-copper alloy, tin-bismuth alloy, and tin-indium alloy, these alloys having excellent mechanical properties. First connection member 12 is a conductive member, and it is a copper wire or a gold wire, for example.

As illustrated in FIG. 1B, photoelectric conversion region 8 of first semiconductor element 1 is exposed from an opening of redistribution layer 10. Electrode pad 11 on redistribution layer 10 connected to electrode pad 13 of base 5 may be disposed not only on the region of extended portion 2 but also on the region of first semiconductor element 1, so long as electrode pad 11 is disposed on the region other than the region where second semiconductor element 3 is to be mounted.

Second semiconductor element 3 is a semiconductor element (semiconductor chip) including a circuit formed on a silicon substrate. Second semiconductor element 3 has on its main surface a circuit receiving and transmitting electric signals with first semiconductor element 1. For example, second semiconductor element 3 includes a drive circuit for driving the photoelectric conversion portion on first semiconductor element 1 and an analog front end (AFE) circuit for converting an analog image electric signal from first semiconductor element 1 into a digital signal.

Second semiconductor element 3 is mounted to extend from a peripheral edge of first semiconductor element 1 to extended portion 2 without being mounted on photoelectric conversion region 8 so as not to prevent collection of light on photoelectric conversion region 8. A third electrode and a fourth electrode are disposed on the main surface of second semiconductor element 3, wherein the third electrode is mounted to surface the region of first semiconductor element 1 and the fourth electrode is mounted to surface the region of extended portion 2. In this case, the third electrode is connected to the first electrode of redistribution layer 10 via a bonding member, and the fourth electrode is connected to the second electrode of redistribution layer 10 via a bonding member. The bonding member is a conductive member, and it is a metal bump, for example. Adhesive layer 14 may be formed between second semiconductor element 3 and the main surface of first semiconductor element 1 and between second semiconductor element 3 and the first surface of extended portion 2, for reinforcement of a bonding portion. Adhesive layer 14 is an underfill material that is an adhesive reinforcement material. A material such as liquid epoxy resin, a resin sheet, or an anisotropic conductive film (ACF) can be used as a material of adhesive layer 14.

As described above, in laminated semiconductor device 100 according to the present exemplary embodiment, the region where second semiconductor element 3 is mounted or the region where electrode pad 11 is mounted can be ensured on the first surface of extended portion 2. Specifically, it is unnecessary to ensure a region for a connection terminal with base 5 at the outside of photoelectric conversion region 8 on first semiconductor element 1, whereby the region where second semiconductor element 3 is to be mounted can be reduced. Specifically, a planar chip size of first semiconductor element 1 does not need to be increased for an external connection, resulting in that a production cost for laminated semiconductor device 100 can be reduced.

In addition, second semiconductor element 3 can be disposed to be sufficiently apart from photoelectric conversion region 8 formed on first semiconductor element 1. This can prevent an optical path between translucent cover 7 and photoelectric conversion region 8 from being shielded by second semiconductor element 3 or a resin or a film protecting a connection portion. With this configuration, heat generated from second semiconductor element 3 or heat generated upon locally heating and bonding first semiconductor element 1 and second semiconductor element 3 during a production process is difficult to be transmitted to photoelectric conversion region 8, and therefore, malfunction of laminated semiconductor device 100 due to heat can be prevented.

Further, an electrical extraction from second semiconductor element 3 to the outside, such as the arrangement of electrode pad 11, is attained on extended portion 2. Therefore, a circuit design of first semiconductor element 1 and second semiconductor element 3 becomes easy, whereby a chip designing period can be shortened and a chip designing cost can be reduced.

The effect involved with laminated semiconductor device 100 according to the present disclosure becomes more noticeable, when first semiconductor element 1 has increased number of pixels. Specifically, even if a circuit scale of second semiconductor element 3 increases with the increased number of pixels, and a chip size also increases, the region where second semiconductor element 3 is to be mounted can be ensured by adjusting the region of extended portion 2. Accordingly, the size of first semiconductor element 1 can be kept small. Even if the number of terminals of second semiconductor element 3 is increased, the electrode arrangement can be adjusted to ensure the bonding portion on extended portion 2. Accordingly, second semiconductor element 3 can be formed with a simple circuit design.

Figure 2:
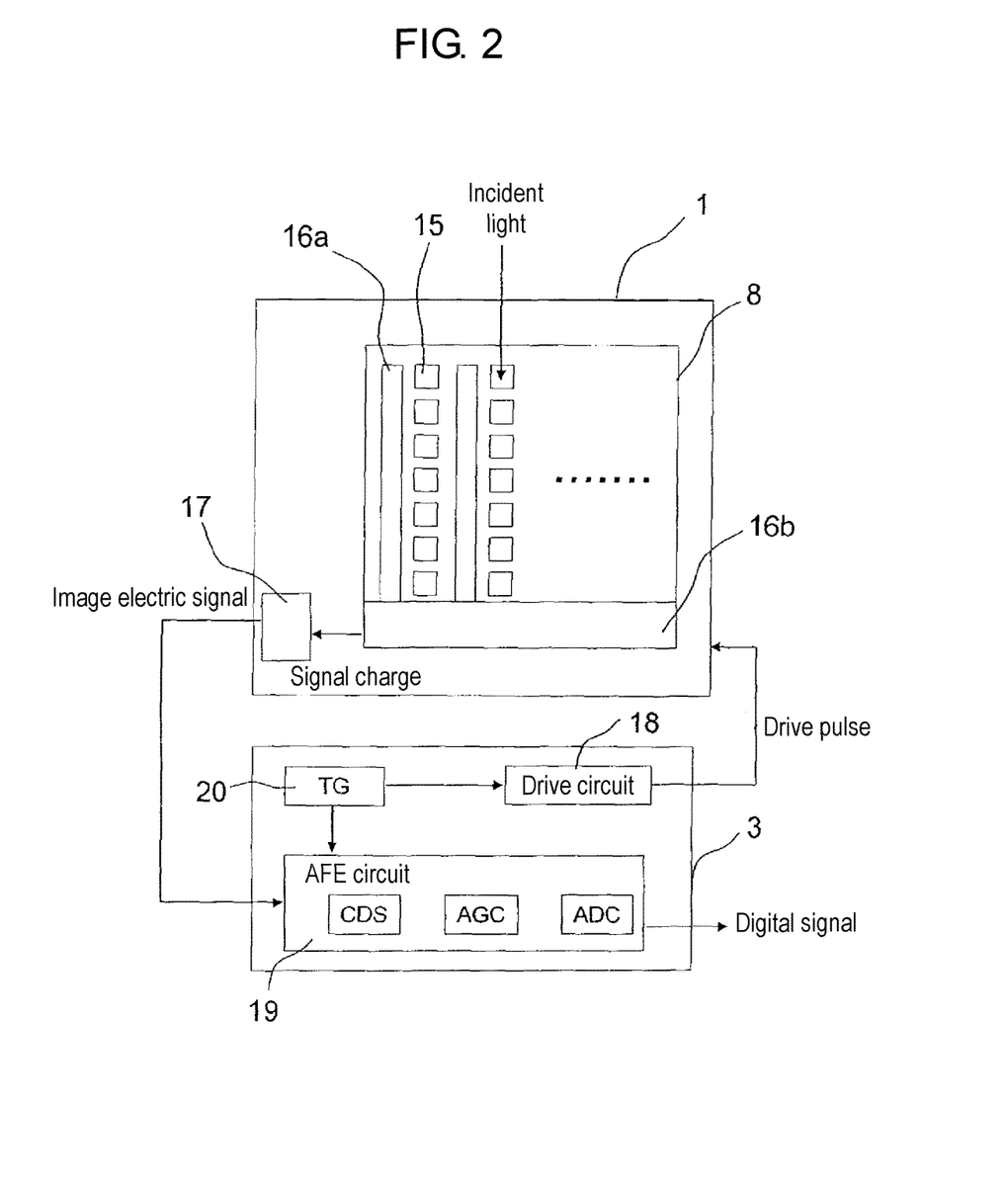
FIG. 2 is a block diagram illustrating internal circuits and operations of first and second semiconductor elements in the laminated semiconductor device according to the first exemplary embodiment.

FIG. 2 is a block diagram illustrating one example of internal circuits and operations of first semiconductor element 1 and second semiconductor element 3 in laminated semiconductor device 100.

A plurality of photoelectric conversion circuits 15 arranged in a matrix, and vertical transfer unit 16a and horizontal transfer unit 16b provided to correspond to each row of photoelectric conversion circuits 15 are disposed on photoelectric conversion region 8 of first semiconductor element 1. Each photoelectric conversion circuit 15 photoelectrically converts incident light to generate signal charges. Vertical transfer unit 16a reads the signal charges generated in each photoelectric conversion circuit 15, and transfers the read signal charges to horizontal transfer unit 16b. Horizontal transfer unit 16b transfers the transferred signal charges to output circuit unit 17 in same first semiconductor element 1. Output circuit unit 17 converts the transferred signal charges into an analog image electric signal, and outputs this signal to second semiconductor element 3.

Second semiconductor element 3 includes drive circuit 18, AFE circuit 19, and timing generator (TG) 20. Drive circuit 18 generates a drive pulse based on a timing signal generated from TG 20, and outputs the generated pulse to first semiconductor element 1. Here, the drive pulse includes drive pulses for driving each of vertical transfer unit 16a, horizontal transfer unit 16b, and output circuit unit 17. First semiconductor element 1 performs a series of operations from an operation of reading the signal charges generated in photoelectric conversion circuit 15 to an operation of outputting an image electric signal from output circuit unit 17, based on the drive pulses. AFE circuit 19 preforms an ADC (Analog Digital Converter) to convert the analog image electric signal generated from output circuit unit 17 into a digital signal based on the timing signal generated from TG 20. AFE circuit 19 may perform a CDS (Correlated Double Sampling) or an AGC (Auto Gain Control) as a pre-treatment of the ADC. The converted digital signal is output to the outside of second semiconductor element 3.

The image electric signal output from first semiconductor element 1 to second semiconductor element 3 is transmitted from the first electrode on redistribution layer 10 to the third electrode of second semiconductor element 3. The digital signal output from second semiconductor element 3 is transmitted to the second electrode of redistribution layer 10 from the fourth electrode of second semiconductor element 3, and then, transmitted from electrode pad 11 electrically connected to the second electrode to electrode pad 13 of package 4 via first connection member 12. Thereafter, the digital signal is output to the outside of laminated semiconductor device 100 via an external terminal (not illustrated) of package 4.

In one example of the internal circuits described above, first semiconductor element 1 is a CCD image sensor. However, first semiconductor element 1 may be a CMOS image sensor or an image sensor of other mechanism. Use of a CMOS image sensor is effective to suppress power consumption. In summary, any image sensor can be used, so long as the image sensor can capture a subject image to generate image data. The circuits mounted on second semiconductor element 3 are not limited to the above-mentioned drive circuit 18, AFE circuit 19, and TG 20. The circuits mounted on second semiconductor element 3 may not include these circuits, or may have other functions. In summary, the circuits mounted on second semiconductor element 3 may physically be configured in any way, so long as the circuits can receive an image electric signal and output a digital signal.

An electronic component other than a semiconductor element may be mounted in place of second semiconductor element 3 or in addition to second semiconductor element 3. The ADC function is essential to AFE circuit 19, but other functions can selectively be provided to AFE circuit 19.

Figure 3:
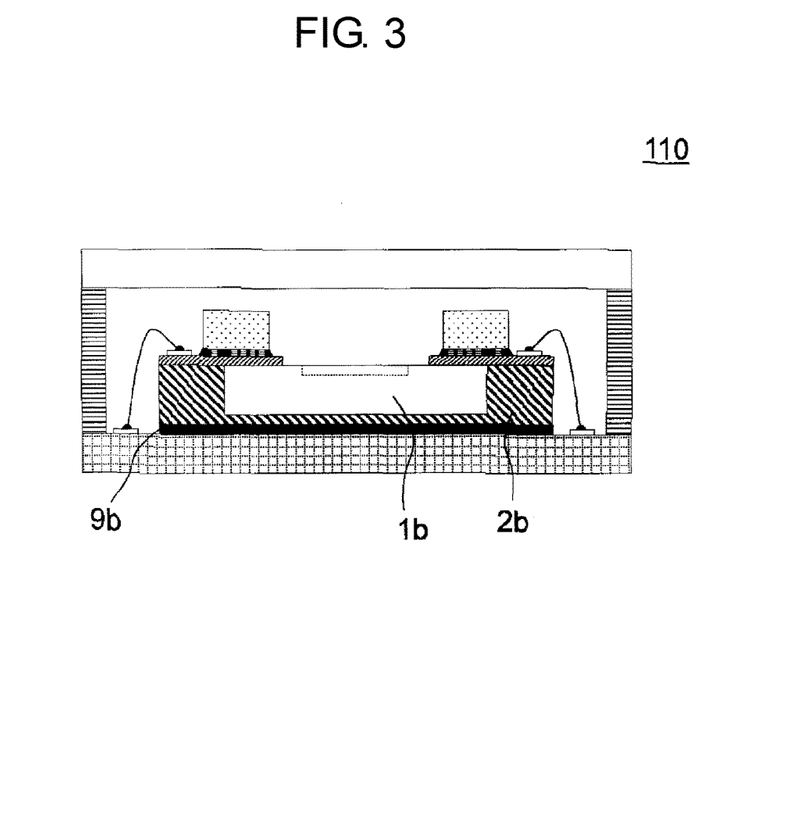
FIG. 3 is a sectional view illustrating another configuration of the laminated semiconductor device according to the first exemplary embodiment.

Extended portion 2 formed outside first semiconductor element 1 is not limited to the form illustrated in FIGS. 1A and 1B. Extended portion 2 may be formed in any manner, so long as extended portion 2 can ensure the region where second semiconductor element 3 is to be mounted and the region where electrode pad 13 that is a connection terminal to the outside is formed. Extended portion 2 covers only the side surface of first semiconductor element 1 in laminated semiconductor device 100 illustrated in FIG. 1A. However, an extended portion may be configured as extended portion 2b illustrated in FIG. 3 to cover both a side surface and a back surface of first semiconductor element 1b, for example. In this case, a back surface of extended portion 2b is fixed to base 5 via adhesive layer 9b. Laminated semiconductor device 110 illustrated in FIG. 3 has extended portion 2b formed continuously from the side surface to the back surface of first semiconductor element 1b, whereby thermal stress applied to an extended semiconductor element including first semiconductor element 1b and extended portion 2b is stabilized, and therefore, a warp can be improved. Furthermore, this configuration provides effects of enhancing a yield of a production process and enhancing reliability of laminated semiconductor device 100. Extended portion 2 is not necessarily formed on four side surfaces of semiconductor element 1 as illustrated in FIG. 1B, but may be formed on only a pair of opposing side surfaces. For example, when the number of electrode pads 13 that should be extracted is small, or when electrode pads 13 can be disposed with a narrow pitch, the region of extended portion 2 can be minimized to downsize laminated semiconductor device 100.

A lens layer including a plurality of microlenses corresponding to each of photoelectric conversion circuits 15 may be disposed on photoelectric conversion region 8 on first semiconductor element 1 (not illustrated). Each microlens is provided to efficiently collect light incident into semiconductor device 100 through translucent cover 7 to each photoelectric conversion circuit 15. The lens layer may be configured such that semispherical microlenses are arrayed, or may be configured as a digital microlens in which micro rings having a specific refractive index distribution are concentrically disposed.

It is desirable that, at the bonding portion of first semiconductor element 1 and second semiconductor element 3, the pitch of the bonding portion between the first electrode and the third electrode is narrower than the pitch of the bonding portion between the second electrode and the fourth electrode.

Example of Redistribution Layer in First Exemplary Embodiment

An example of a configuration of redistribution layer 10 in laminated semiconductor device 100 described above will be described with reference to FIGS. 4 to 7 each schematically illustrating redistribution layer 10.

Figure 4:
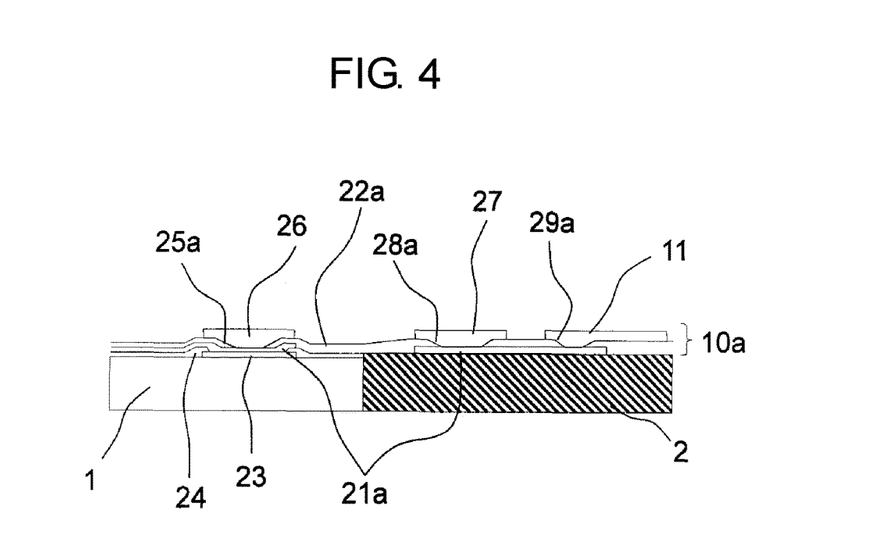
FIG. 4 is a sectional view illustrating an example of a configuration of a redistribution layer in the laminated semiconductor device according to the first exemplary embodiment.

In the example in FIG. 4, redistribution layer 10a including redistribution 21a and protection layer 22a covering redistribution 21a is formed on the main surface of first semiconductor element 1 and the first surface of extended portion 2, wherein protection layer 22a is continuously formed from first semiconductor element 1 to extended portion 2 across a boundary. More specifically, redistribution layer 10a is disposed on electrode 23 formed on the main surface of first semiconductor element 1 and insulating film 24 covering the main surface with a part of electrode 23 being exposed. Redistribution 21a is connected to electrode 23 exposed from an opening of insulating film 24, and redistribution 21a is also exposed from opening 25a of protection layer 22a to be connected to first electrode 26. Redistribution 21a and protection layer 22a are also formed on the first surface of extended portion 2. Second electrode 27 is connected to redistribution 21a exposed from opening 28a of protection layer 22a, and electrode pad 11 is formed to be connected to redistribution 21a exposed from opening 29a of protection layer 22a. First electrode 26 and second electrode 27 are respectively bonded to the third electrode and the fourth electrode provided on second semiconductor element 3. An output signal from second semiconductor element 3 is extracted to electrode pad 11 via second electrode 27 and redistribution 21a.

Figure 5:
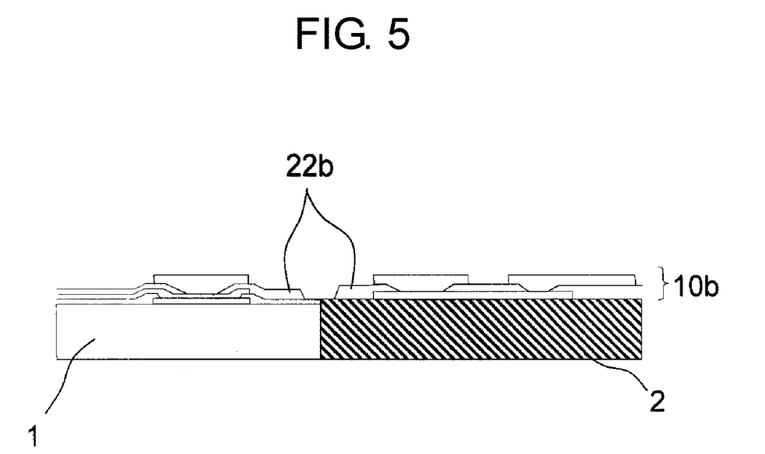
FIG. 5 is a sectional view illustrating an example of a configuration of a redistribution layer in the laminated semiconductor device according to the first exemplary embodiment.

In the example illustrated in FIG. 5, redistribution layer 11b is not formed in the region in the vicinity of the interface between first semiconductor element 1 and extended portion 2. Specifically, redistribution layer 10b is separately provided on the main surface of first semiconductor element 1 and the first surface of extended portion 2, and protection layer 22b does not extend across the boundary between first semiconductor element 1 and extended portion 2. This is different from the example in FIG. 4. This configuration can prevent disconnection of redistribution layer 10b due to thermal stress in the vicinity of the interface between first semiconductor element 1 and extended portion 2.

Figure 6:
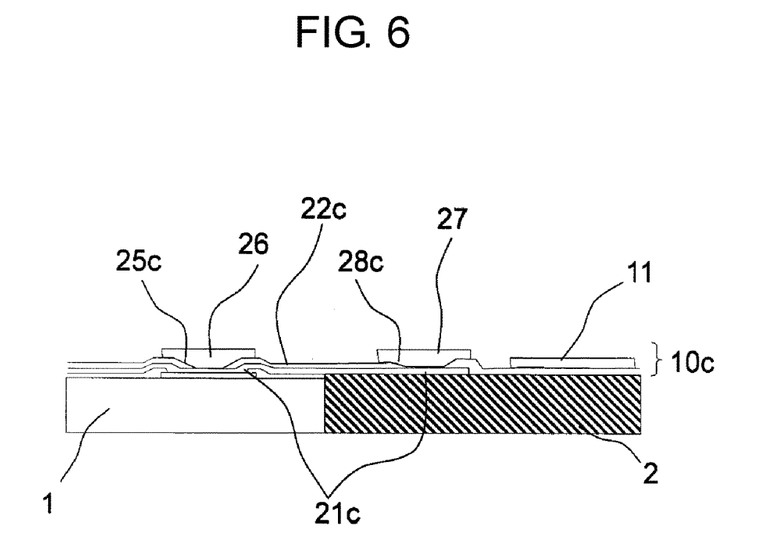
FIG. 6 is a sectional view illustrating an example of a configuration of a redistribution layer in the laminated semiconductor device according to the first exemplary embodiment.

In redistribution layer 10c illustrated in FIG. 6, redistribution 21c and protection layer 22c are continuously formed across the boundary from first semiconductor element 1 to extended portion 2. Specifically, redistribution 21c connected to first electrode 26 in opening 25c is extracted to a portion just below second electrode 27 across the boundary between first semiconductor element 1 and extended portion 2, and connected to second electrode 27 in opening 28c. Although not illustrated, redistribution 21c may be extracted to a portion just below electrode pad 11 to be connected to electrode pad 11. With this configuration, redistribution 21c having larger size and smaller resistance than the wiring in first semiconductor element 1 can preferentially be used as a transfer path, whereby an electric signal can more stably be transferred between first semiconductor element 1 and extended portion 2.

Figure 7:
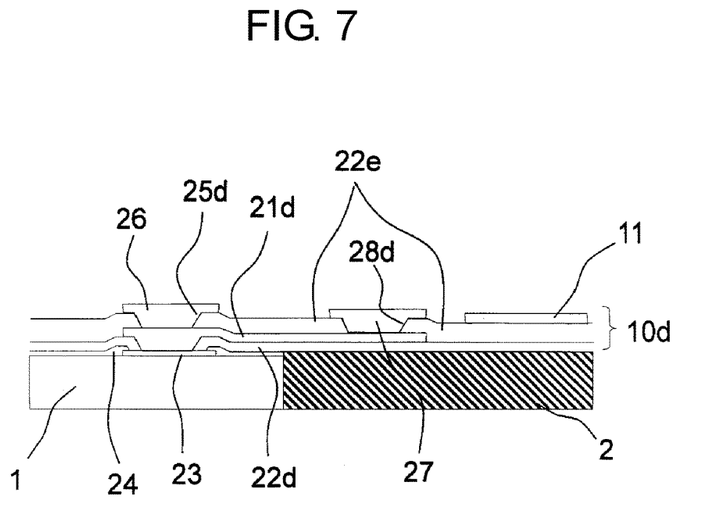
FIG. 7 is a sectional view illustrating an example of a configuration of a redistribution layer in the laminated semiconductor device according to the first exemplary embodiment.

In the example in FIG. 7, the number of the layers in redistribution layer 10d is two. Specifically, protection layer 22d which is the first layer of redistribution layer 10d is formed on insulating film 24 covering the main surface of first semiconductor element 1 with a part of electrode 23 being exposed. Protection layer 22d is opened along an opening of insulating film 24 which exposes electrode 23, and redistribution 21d is connected to electrode 23 in this opening. Protection layer 22d is formed to extend to the first surface of extended portion 2 across the boundary between first semiconductor element 1 and extended portion 2. Redistribution 21d formed on protection layer 22d is also extracted to a portion just below second electrode 27 across the boundary between first semiconductor element 1 and extended portion 2. Protection layer 22e which is the second layer is formed on protection layer 22d and redistribution 21d in the first layer. Protection layer 22e which is the second layer has opening 25d exposing redistribution 21d in the region of first semiconductor element 1. First electrode 26 and redistribution 21*d* are connected in opening 25*d*. Protection layer 22*e* also has opening 28*d* exposing redistribution 21*d* in the region of extended portion 2. Second electrode 27 and redistribution 21*d* are connected in opening 28*d*. The number of the layers in a redistribution layer is not limited to one and two. Three or more layers may be formed in the redistribution layer.

With the above configuration, redistribution 21*d* does not directly extend across the boundary between first semiconductor element 1 and extended portion 2, and this can prevent disconnection of redistribution 21*d* due to thermal stress in the vicinity of the interface between first semiconductor element 1 and extended portion 2.

Although not illustrated, the thickness of redistribution 21 may be increased or the line width of redistribution 21 may be increased in the boundary between first semiconductor element 1 and extended portion 2 more than in the other region, as another configuration example of preventing disconnection of redistribution layer 10 due to thermal stress in the vicinity of the interface between first semiconductor element 1 and extended portion 2.

First Modification of First Exemplary Embodiment

In laminated semiconductor device 100 illustrated in FIGS. 1A and 1B, electrode pad 11 in redistribution layer 10 is connected to electrode pad 13 of base 5 with wire-type first connection member 12. This configuration needs to form a horizontal space enabling a wire connection between electrode pad 11 and electrode pad 13, which affects a planar size of laminated semiconductor device 100.

Figure 8:
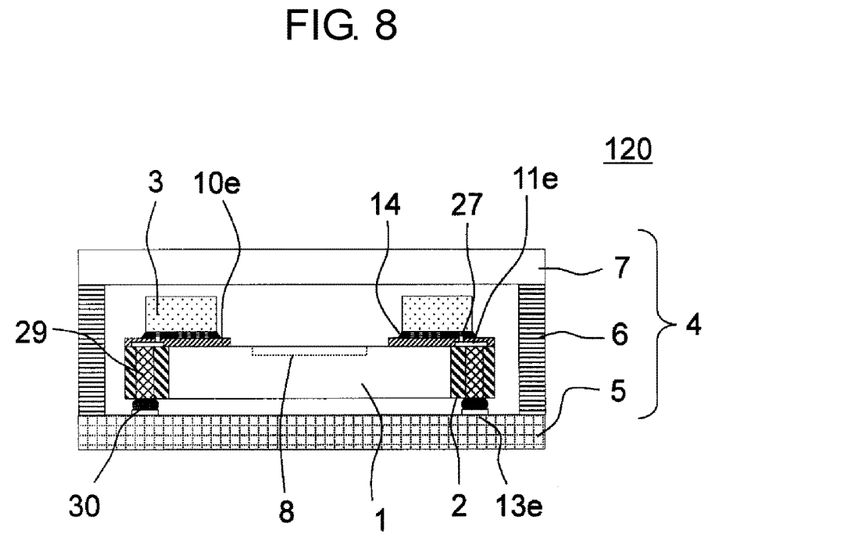
FIG. 8 is a sectional view illustrating a configuration of a laminated semiconductor device according to a first modification of the first exemplary embodiment.

FIG. 8 is a sectional view schematically illustrating a laminated semiconductor device according to a first modification of the first exemplary embodiment.

Laminated semiconductor device 120 illustrated in FIG. 8 includes through-electrode 29 penetrating from the first surface of extended portion 2 to a second surface opposite to the first surface as a component for connecting electrode pad 11*e* of redistribution layer 10*e* and electrode pad 13*e* of base 5 to each other.

Through-electrode 29 is connected to electrode pad 11*e* of redistribution layer 10*e* on the first surface of extended portion 2, and is connected to electrode pad 13*e* of base 5 via second connection member 30 on the second surface. Through-electrode 29 is formed by filling a through-hole formed on extended portion 2 with a conductor, or by covering the inner wall of the through-hole with a conductive material with a method such as plating. Second connection member 30 is a conductive member such as a metal bump and ACF.

Electrode pad 11*e* of first semiconductor element 1 and electrode pad 13*e* of package 4 are connected to each other not with a wire but with through-electrode 29 formed on extended portion 2, whereby electrode pad 11*e* of redistribution layer 10*e* can be disposed to be overlapped with the region where second semiconductor element 3 is to be mounted. Specifically, second electrode 27 and electrode pad 11*e* may be formed on redistribution layer 10*e* so as to be vertically overlapped with each other in the region of extended portion 2.

With this configuration, first semiconductor element 1 and package 4 can be bonded just below extended portion 2, whereby the package can be downsized more, compared to laminated semiconductor devices 100 and 110 using a wire connection.

Figure 9:
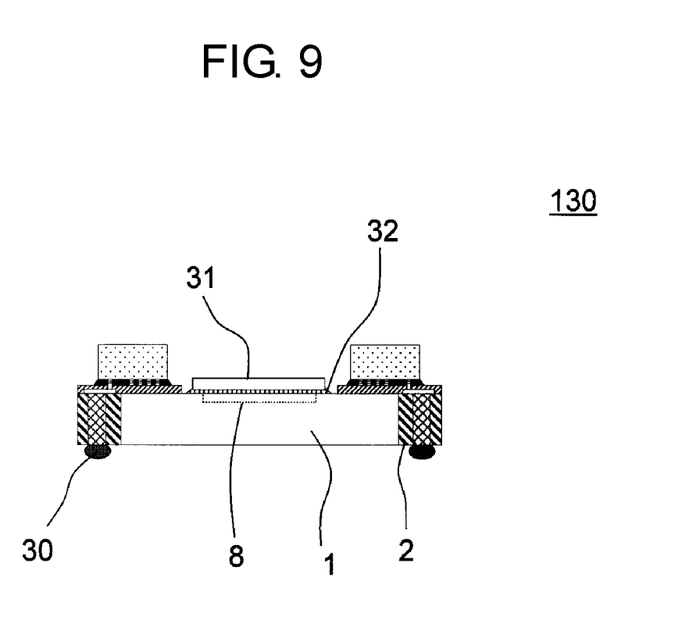
FIG. 9 is a sectional view illustrating another configuration of the laminated semiconductor device according to the first modification of the first exemplary embodiment.

As another embodiment of this modification, glass 31 covering photoelectric conversion region 8 of first semiconductor element 1 can be bonded with transparent adhesive agent 32, in place of translucent cover 7, as illustrated in FIG. 9. With this configuration, side wall 6 on which translucent cover 7 is placed and base 5 for fixing side wall 6 become unnecessary, whereby laminated semiconductor device 130 without package 4 can be configured. Accordingly, further miniaturization can be attained. Laminated semiconductor device 130 is a chip size package (CSP) of an extended semiconductor chip including first semiconductor element 1 and extended portion 2. It can directly be mounted on a mother board of a module by using second connection member 30 as an external terminal, for example.

Second Modification of First Exemplary Embodiment

In laminated semiconductor device 100 illustrated in FIGS. 1A and 1B, redistribution layer 10 is formed on first semiconductor element 1 and extended portion 2. In this configuration, the interface between first semiconductor element 1 and extended portion 2 becomes a portion where thermal stress is concentrated due to a difference in thermal expansion between a material of extended portion 2 and a material of first semiconductor element 1, and this portion might cause damage or disconnection of redistribution layer 10.

Figure 10A:
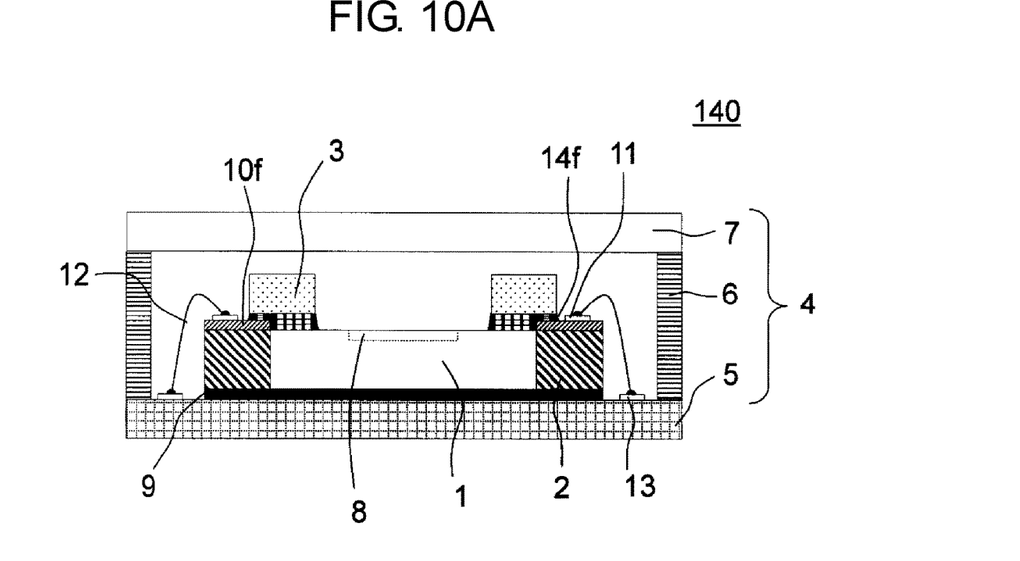
FIG. 10A is a sectional view illustrating a configuration of a laminated semiconductor device, taken along a line Xa-Xa in FIG. 10B, according to a second modification of the first exemplary embodiment.
Figure 10B:
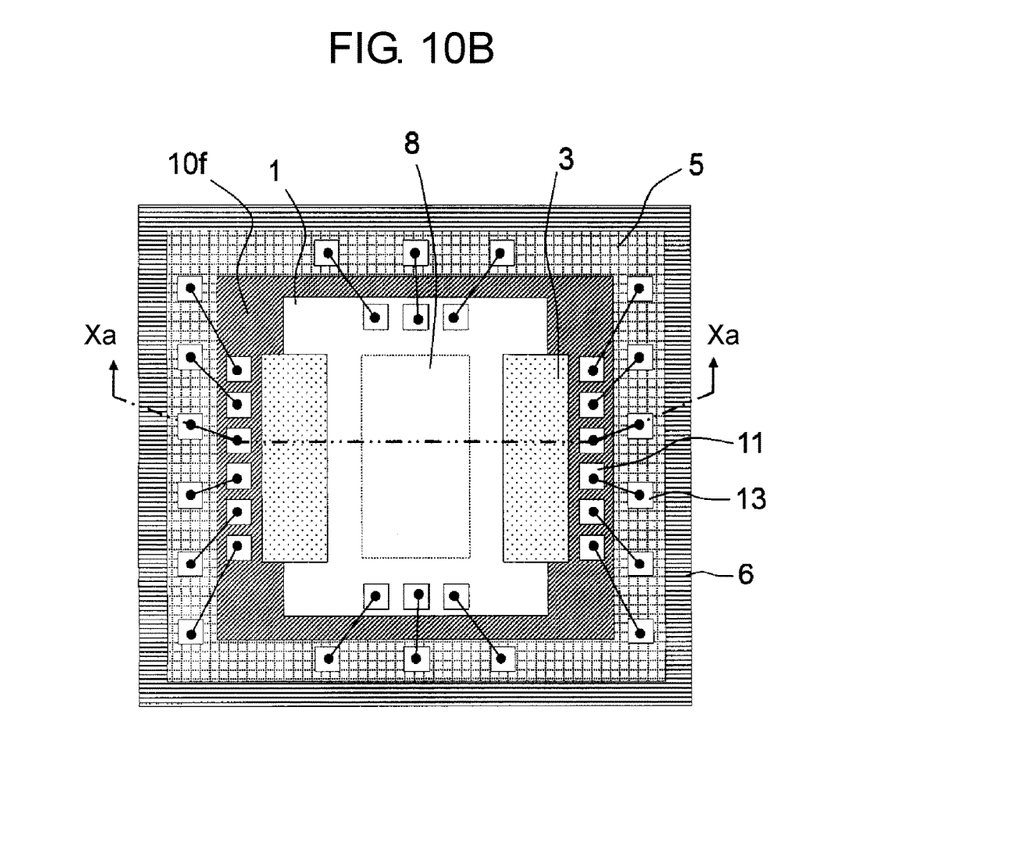
FIG. 10B is a plan view illustrating the configuration of the laminated semiconductor device according to the second modification of the first exemplary embodiment.

FIGS. 10A and 10B are respectively a sectional view and a plan view, schematically illustrating a configuration of a laminated semiconductor device according to a second modification of the first exemplary embodiment.

Laminated semiconductor device 140 illustrated in FIG. 10A includes redistribution layer 10*f* provided on a first surface of extended portion 2 without being provided on a main surface of first semiconductor element 1.

Redistribution layer 10*f* includes second electrode 27 connected to a fourth electrode of second semiconductor element 3, and electrode pad 11 which is provided outside second electrode 27 and is connected to electrode pad 13 of base 5 via first connection member 12. An image electric signal output from the first semiconductor element 1 is transmitted from an electrode formed on the main surface of the first semiconductor element 1 to a third electrode of second semiconductor element 3 via a bonding member. A digital signal A/D converted by second semiconductor element 3 is transmitted to the second electrode of redistribution layer 10*f* from the fourth electrode, and further transferred to electrode pad 13 of base 5 via electrode pad 11.

With this configuration, redistribution layer 10*f* is formed so as not to extend across the boundary between first semiconductor element 1 and extended portion 2, the boundary being a portion where thermal stress is concentrated. Therefore, the electric image signal output from first semiconductor element 1 is transferred to extended portion 2 through second semiconductor element 3 and transferred to package 4. Accordingly, the digital signal can be stabilized, image quality can be enhanced, and reliability as a semiconductor device can be enhanced.

In FIG. 10B, the boundary between first semiconductor element 1 and extended portion 2 is illustrated to be flush with the inner end of redistribution layer 10*f*. However, it is only necessary that redistribution layer 10*f* does not extend across the boundary between first semiconductor element 1 and extended portion 2 in the second modification, and the end of redistribution layer 10*f* may be formed close to extended portion 2.

In first semiconductor element 1 illustrated in the present second modification, a height difference between the electrodes, which are formed on the main surface of first semiconductor element 1 and are connected respectively to the third electrode and the fourth electrode of second semiconductor element 3, and the second electrode of redistribution layer 10*f* has to be considered, the height difference being caused by the presence of redistribution layer 10f. With respect to the height of the bonding member for the bonding surface, when second electrode 27 is higher than the electrodes on the main surface of first semiconductor element 1, bonding reliability might be deteriorated due to the height difference between electrodes when the same bonding member is used.

Figure 11:
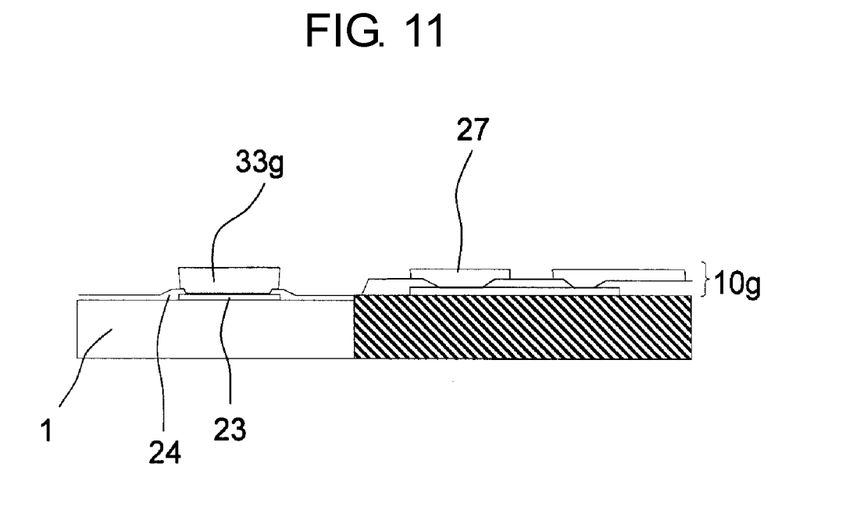
FIG. 11 is a sectional view illustrating another configuration of the laminated semiconductor device according to the second modification of the first exemplary embodiment.

For this problem, in first semiconductor element 1 illustrated in FIG. 11, the thickness of the electrode formed on the main surface of first semiconductor element 1 is adjusted to eliminate the height difference, i.e., to allow the electrode to have the same height as second electrode 27 on redistribution layer 10g. Specifically, the height of fifth electrode 33g connected to electrode 23 of first semiconductor element 1 in the opening of insulating film 24 is adjusted to be the same as the height of second electrode 27. With this configuration, any problem involved with the height difference between the electrodes is not caused even if the same bonding member is used. Thus, bonding reliability between first semiconductor element 1 and second semiconductor element 3 can be ensured.

Figure 12:
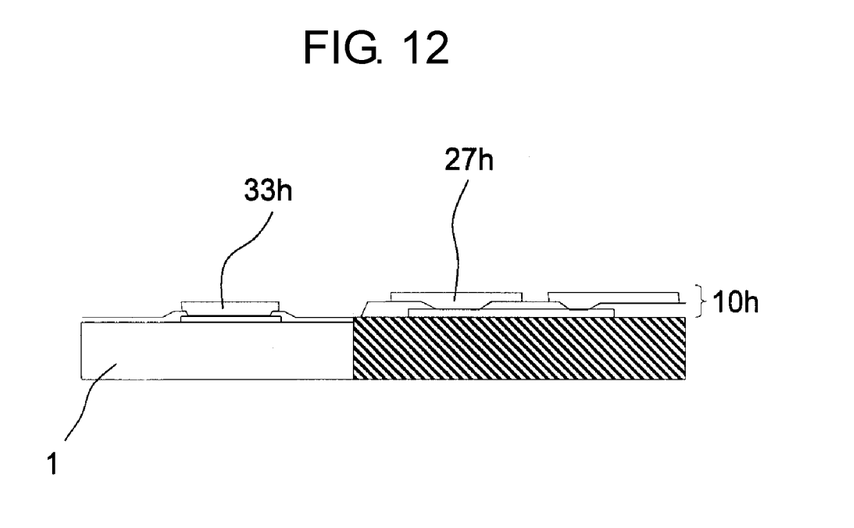
FIG. 12 is a sectional view illustrating another configuration of the laminated semiconductor device according to the second modification of the first exemplary embodiment.

In FIG. 12, a planar size of second electrode 27 on redistribution layer 10h is increased to adjust the height of the bonding member during reflow. Specifically, the planar size of second electrode 27h is set larger than the planar size of fifth electrode 33h with the height of fifth electrode 33h being smaller than second electrode 27h. With this configuration, when a solder is used as the bonding member for bonding, for example, the wetting and spreading of the molten solder on second electrode 27h increases because of the large planar size, so that the bonding member becomes low. With this, the height difference between fifth electrode 33h and second electrode 27h is reduced, and therefore bonding reliability can be ensured.

The features in FIGS. 11 and 12 may be combined. Specifically, the first electrode is formed thicker than the second electrode, and the planar size of the second electrode is formed larger than the planar size of the first electrode to ensure bonding reliability.

Second Exemplary Embodiment

Figure 13A:
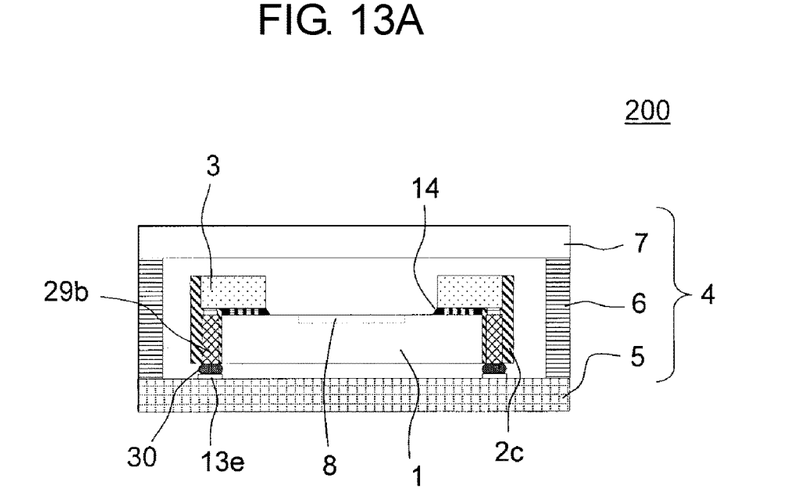
FIG. 13A is a sectional view illustrating a configuration of a laminated semiconductor device, taken along a line XIIIa-XIIIa in FIG. 13B, according to a modification of the second exemplary embodiment.
Figure 13B:
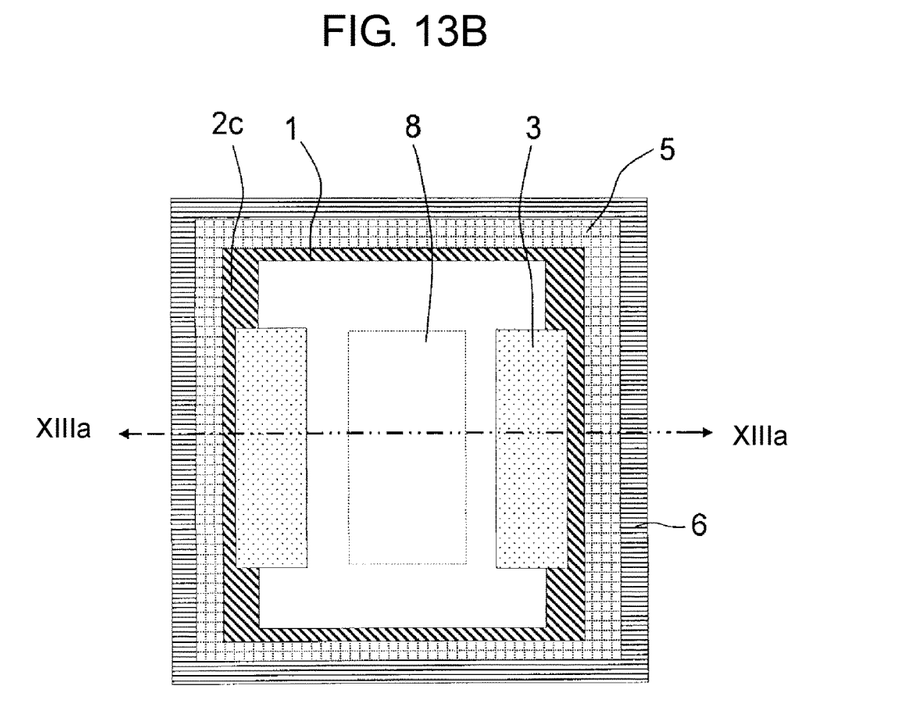
FIG. 13B is a plan view illustrating the configuration of the laminated semiconductor device according to the modification of the second exemplary embodiment.

FIGS. 13A and 13B are respectively a sectional view and a plan view, schematically illustrating a configuration of a laminated semiconductor device according to the present exemplary embodiment. The different points from the first exemplary embodiment and its modifications will mainly be described below. Therefore, the description will be simplified, or some components will be omitted.

Laminated semiconductor device 200 illustrated in FIG. 13A includes first semiconductor element 1, second semiconductor element 3 placed on first semiconductor element 1, extended portion 2c extended outwardly from side end surfaces of first semiconductor element 1 and second semiconductor element 3, and package 4 sealing first semiconductor element 1 and second semiconductor element 3.

Second semiconductor element 3 is mounted to protrude from the peripheral edge of first semiconductor element 1 outwardly from the side end surface without being mounted on photoelectric conversion region 8 so as not to prevent collection of light on photoelectric conversion region 8. The main surface of second semiconductor element 3 has a first region where a third electrode is provided and a second region where a fourth electrode is provided. The first region is bonded to the electrode on the main surface of first semiconductor element 1, while the second region is covered with extended portion 2c except for the fourth electrode. Adhesive layer 14 may be formed between the main surface of first semiconductor element 1 and the first region of second semiconductor element 3 for reinforcement of the bonding portion.

Extended portion 2c is extended outwardly from both the side end surface of first semiconductor element 1 and the side end surface of second semiconductor element 3, and is integrally formed. Through-electrode 29b connected to the fourth electrode of second semiconductor element 3 and penetrating to the back surface of the extended portion 2c is formed on extended portion 2c. Through-electrode 29b is connected to electrode pad 13e of base 5 via second connection member 30.

FIG. 13B illustrates that extended portion 2c is formed on four sides of first semiconductor element 1. However, extended portion 2c is not limited thereto, since extended portion 2c mainly has a function of an external extraction from second semiconductor element 3 with through-electrode 29b. For example, extended portion 2c may be formed along only opposing two sides on which second semiconductor element 3 is provided. Alternatively, extended portion 2c may be formed not from end to end of the side, but on a part of the side. In FIG. 13B, a gap is formed between extended portion 2c and side wall 6. However, extended portion 2c and side wall 6 may be in contact with each other for further downsizing the package.

As described above, in laminated semiconductor device 200 according to the present exemplary embodiment, second semiconductor element 3 can be provided such that only the first region connected to first semiconductor element 1 is overlapped with first semiconductor element 1, and the other region is outside the first chip. Specifically, a chip size of first semiconductor element 1 is only set to ensure desired photoelectric conversion region 8. Therefore, it becomes unnecessary to ensure a region for a connection terminal with base 5 at the outer periphery of photoelectric conversion region 8, so that the region where second semiconductor element 3 is to be mounted can be reduced. Thus, the chip size can be reduced. Specifically, it becomes unnecessary to increase a planar chip size of first semiconductor element 1 for an external connection, and thus production cost can be reduced.

In addition, second semiconductor element 3 can be disposed on a position sufficiently apart from photoelectric conversion region 8 formed on first semiconductor element 1. This can prevent an optical path between translucent cover 7 and photoelectric conversion region 8 from being shielded by second semiconductor element 3, or a resin or a film protecting the connection portion. In addition, heat generated from second semiconductor element 3 or heat upon bonding first semiconductor element 1 and second semiconductor element 3 with local application of heat during a production process is difficult to be transferred to photoelectric conversion region 8. Thus, malfunction of laminated semiconductor device 200 due to heat can be prevented.

Since an external electric extraction from second semiconductor element 3 to the outside is attained by extended portion 2c, a circuit design of first semiconductor element 1 and second semiconductor element 3 becomes easy. With this, the chip designing period can be shortened and the designing cost can be reduced.

In addition, second semiconductor element 3 can be connected to electrode pad 13e of base 5 just below the fourth electrode of second semiconductor element 3 with through-electrode 29b formed on extended portion 2c. Therefore, the increase in the horizontal size due to the external extraction from second semiconductor element 3 is not caused, resulting in that further miniaturization of laminated semiconductor device 200 can be implemented.

The present exemplary embodiment provides the effects described below, compared to the first exemplary embodiment and its modifications. An electric signal from first semiconductor element 1 can be extracted via second semiconductor element 3 and through-electrode 29b. This configuration eliminates the need to form a redistribution layer, thereby simplifying the process and reducing the production cost. In addition, a misalignment upon forming electrode pads or bumps caused by a misalignment of masks can be avoided during the process of forming redistribution, whereby the pitch between bumps can be decreased, and therefore, the number of bumps that can be disposed can be increased. Accordingly, this configuration is more effective to downsize an image sensor chip with increased number of pixels and to reduce production cost.

As another embodiment of the present exemplary embodiment, glass 31 covering photoelectric conversion region 8 of first semiconductor element 1 can be bonded with transparent adhesive agent 32, in place of translucent cover 7, as in FIG. 9. Specifically, laminated semiconductor device 200 without package 4 can be configured as a chip size package (CSP), whereby further miniaturization of laminated semiconductor device 200 can be implemented.

Other Exemplary Embodiments

The first exemplary embodiment, its modifications, and the second exemplary embodiment have been described above as examples of the technique disclosed in the present application. However, the technique in the present disclosure is not limited thereto, and it can be applied to other embodiments in which changes, substitutions, additions, and omissions are appropriately made. In addition, each constituent element described in the first exemplary embodiment, its modifications, and the second exemplary embodiment described above can be combined to provide a new exemplary embodiment.

The examples of the other exemplary embodiments will collectively be described below.

The number of second semiconductor element 3 mounted on first semiconductor element 1 is not limited to two, but may be one, or three or more. When three or more of second semiconductor elements 3 are mounted, a thermal conductive member extending from each second semiconductor element to package 4 may be mounted to provide heat release effect. When one second semiconductor element 3 is mounted, an area of photoelectric conversion region 8 formed on first semiconductor element 1 can be increased. When photoelectric conversion region 8 is not extended, a length of each side of first semiconductor element 1 can be decreased to reduce a chip size.

A planar shape of first semiconductor element 1 and second semiconductor element 3 is not limited to a rectangle, and it is not particularly limited. However, a rectangle is efficient to increase the number of chips obtained per one wafer.

As for a flip-chip connection of second semiconductor element 3 to first semiconductor element 1, the bonding member is not limited to a bump made of gold or solder. Other bonding methods such as a surface activated bonding can be used.

First semiconductor element 1 is not limited to an image sensor chip having photoelectric conversion region 8. For example, the configuration in the present disclosure is applicable to a semiconductor module including a light-receiving element such as an optical pickup, and a light-emitting element such as an LED element or a semiconductor laser element. First semiconductor element 1 may be a semiconductor chip (such as MEMS) having a sensor structure other than an optical system, instead of photoelectric conversion region 8. Specifically describing a semiconductor module having a light-emitting element as one example, a semiconductor chip on which a light-emitting element is formed corresponds to first semiconductor element 1, and a semiconductor chip on which a drive circuit for driving the light-emitting element is formed corresponds to the second semiconductor element 3.

The external terminal of package 4 may be formed in a peripheral manner or an areal manner on the back surface of base 5, or may be disposed on the side surface as an external lead line. The shape of the external lead line is not particularly limited.

Base 5 is not limited to a wiring board, but may be a lead frame. In this case, first semiconductor element 1 is mounted on a die pad. Instead of electrode pad 13, an inner lead is electrically connected to an electrode of second semiconductor element 3 via first connection member 12 and electrode pad 11, or via second connection member 30 and through-electrode 29.

In all of the exemplary embodiments and modifications described above, sizes and positional relations described as being "the same" allow a production error. Specifically, they include substantially the same range, even if there is a little error.

The exemplary embodiments and modifications have been described above as illustrative examples of the technique in the present disclosure. The accompanying drawings and the detailed description are provided for this purpose. Therefore, components appearing in the accompanying drawings and the detailed description contain not only the components essential for solving the technical problems set forth herein, but also the components that are not essential for solving the technical problems, but are merely used to illustrate the technique described herein. Therefore, those non-essential components should not readily be recognized as being essential for the reason that they appear in the accompanying drawings and/or in the detailed description.

Furthermore, since the exemplary embodiments and modifications described above are intended to illustrate the technique in the present disclosure, various changes, substitutions, additions, omissions, and the like can be made within the scope of the claims and the scope of equivalents thereof.

The present disclosure is applicable to a laminated semiconductor device including an electronic component stacked on a surface having a light-receiving region or a light-emitting region. The present disclosure is suitably used for an imaging semiconductor device and imaging module, each of which includes an image sensor chip.

What is claimed is:

1. A laminated semiconductor device comprising:
   a first semiconductor element having a main surface, on which a photoelectric conversion region and a surrounding region surrounding the photoelectric conversion region are provided;
   an extended portion extended outwardly from a side end surface of the first semiconductor element;
   a redistribution layer formed on a first surface of the extended portion;
   an electronic component disposed on the surrounding region and the extended portion, the electronic component not being disposed over the photoelectric conversion region;
   a first electrode pad formed on the redistribution layer;

a first electrode provided on the main surface of the first semiconductor element at a region facing the electronic component;
a second electrode provided on the redistribution layer of the extended portion at a region facing the electronic component; and
third and fourth electrodes provided on a surface of the electronic component, the surface facing the main surface of the first semiconductor element and the first surface of the extended portion, wherein:
an outermost side end surface of the redistribution layer does not extend outwardly from an outermost side end surface of the extended portion in plan view,
the electronic component is electrically connected to the first semiconductor element and the redistribution layer,
the first electrode pad is electrically connected to the electronic component via the redistribution layer,
the electronic component is connected to the first semiconductor element and the extended portion in flip-chip manner,
the first electrode and the third electrode are connected by in the flip-chip manner and the second electrode and the fourth electrode are connected by in the flip-chip manner, and
a pitch of a bonding portion between the first electrode and the third electrode is narrower than a pitch of a bonding portion between the second electrode and the fourth electrode.

2. The laminated semiconductor device according to claim 1, wherein
the redistribution layer is formed on the main surface of the first semiconductor element so as to extend from the region facing the electronic component over the first surface of the extended portion.

3. The laminated semiconductor device according to claim 2, wherein
the redistribution layer is continuously formed across a boundary between the first semiconductor element and the extended portion.

4. The laminated semiconductor device according to claim 2, wherein
the redistribution layer includes a redistribution and a protection layer, the redistribution being formed across a boundary between the first semiconductor element and the extended portion to connect the first electrode and the second electrode.

5. The laminated semiconductor device according to claim 4, wherein:
the protection layer is formed on the redistribution connecting the first electrode and the second electrode, the main surface of the first semiconductor element, and the first surface of the extended portion, and
the protection layer is formed on the main surface of the first semiconductor element and on the first surface of the extended portion such that it covers the redistribution that connects the first electrode and the second electrode.

6. The laminated semiconductor device according to claim 4, wherein
the redistribution has a larger thickness around the boundary between the first semiconductor element and the extended portion than that in another region.

7. The laminated semiconductor device according to claim 4, wherein the redistribution has a larger width around the boundary between the first semiconductor element and the extended portion than that in another region.

8. The laminated semiconductor device according to claim 2, wherein
the redistribution layer is discontinuously formed to avoid the boundary between the first semiconductor element and the extended portion.

9. The laminated semiconductor device according to claim 2, wherein
the first electrode is formed on the redistribution layer.

10. The laminated semiconductor device according to claim 9, wherein
a thickness of the first electrode is greater than a thickness of the second electrode.

11. The laminated semiconductor device according to claim 9, wherein
a planar size of the second electrode is larger than a planar size of the first electrode.

12. The laminated semiconductor device according to claim 1, wherein
the redistribution layer is not formed on the main surface of the first semiconductor element.

13. The laminated semiconductor device according to claim 1, further comprising:
a package including a base on which the first semiconductor element is mounted;
a second electrode pad formed on a surface of the base on which the first semiconductor element is to be mounted; and
a connection member connecting the first electrode pad on the redistribution layer and the second electrode pad on the base.

14. The laminated semiconductor device according to claim 13, wherein:
the connection member is a bonding wire, and
the second electrode pad is disposed outwardly from the extended portion.

15. The laminated semiconductor device according to claim 13, wherein:
the connection member includes a through-electrode penetrating through the extended portion from the first surface to the opposite surface, and a bump disposed between the extended portion and the base, and
the second electrode pad is disposed just below the extended portion.

16. The laminated semiconductor device according to claim 1,
wherein a translucent member is disposed at a position facing the photoelectric conversion region formed on the main surface of the first semiconductor element.

17. The laminated semiconductor device according to claim 1,
wherein the electronic component is a second semiconductor element.

18. The laminated semiconductor device according to claim 1,
wherein the extended portion is made of a resin material.

19. The laminated semiconductor device according to claim 1,
wherein the extended portion is extended outwardly from an outermost side end surface of the first semiconductor element.

* * * * *